(12) United States Patent
Yeager et al.

(10) Patent No.: US 6,194,495 B1
(45) Date of Patent: *Feb. 27, 2001

(54) CYANATE ESTER BASED THERMOSET COMPOSITIONS

(75) Inventors: Gary William Yeager, Schenectady; Yiqun Pan, Clifton Park, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/046,278

(22) Filed: Mar. 23, 1998

(51) Int. Cl.[7] .................................. C08J 3/00; C08K 5/34; C08L 79/00
(52) U.S. Cl. ............................................ 524/101; 524/100
(58) Field of Search ...................... 524/100, 101

(56) References Cited

U.S. PATENT DOCUMENTS

| | | |
|---|---|---|
| 4,097,455 | 6/1978 | Burkhardt et al. . |
| 4,389,516 | 6/1983 | Sugio et al. . |
| 4,496,695 | 1/1985 | Sugio et al. . |
| 4,604,452 | 8/1986 | Shimp . |
| 4,902,752 | 2/1990 | Shimp . |
| 4,983,683 | 1/1991 | Shimp . |
| 5,143,785 | 9/1992 | Pujol et al. . |
| 5,536,765 | * 7/1996 | Papathomas ........................ 524/101 |

FOREIGN PATENT DOCUMENTS

| | | |
|---|---|---|
| 889096 | 1/1999 | (EP) . |
| 1541529 | 3/1979 | (GB) . |
| 05339342 | 12/1993 | (JP) . |
| 08253582 | 10/1996 | (JP) . |

* cited by examiner

Primary Examiner—Patrick D. Niland
(74) Attorney, Agent, or Firm—S. Bruce Brown; Noreen C. Johnson

(57) ABSTRACT

The present invention relates to curable compositions used in circuit boards, structural composite, encapsulating resins, and the like. These compositions comprise at least one of a cyanate ester and a cyanate ester prepolymer, a cyanate ester-free aryloxytriazine, and a catalyst.

21 Claims, No Drawings

CYANATE ESTER BASED THERMOSET COMPOSITIONS

FIELD OF THE INVENTION

The present invention relates to cyanate ester based compositions. This invention further relates to curable and cured compositions, useful in applications wherein excellent dielectric and thermal properties are desired.

BACKGROUND OF THE INVENTION

Cyanate esters have been used as curable resins with desirable electrical and thermal properties. As such, they have found utility as matrix resins in a number of industrial applications. Such applications include printed circuit boards, antenna coatings, structural composites, encapsulating resins, matrix resin for abrasives, and adhesives. Chemistry and applications of cyanate esters are discussed in "The Chemistry and Technology of Cyanate Esters" by I. A. Hamerton ® 1994 Blackie Academic & Professional, an imprint of Chapman & Hall and references therein.

Cyanate ester resins, as described in U.S. Pat. No. 3,553,244, are produced by reacting a phenolic compound with cyanogen halide. Such cyanate esters, upon curing, are known to form hard thermoset matrices through cyclotrimerization of the cyanate ester groups. The cyclotrimerization produces symmetrical aryloxytriazine rings which serve as the crosslink sites in the thermoset matrix. The cure of these resins is accelerated by heating, or alternatively by using catalysts such as those described in U.S. Pat. Nos. 4,330,658, 4,330,669, 4,785,075, and 4,528,366. Curable compositions containing partially cured cyanate ester prepolymers are also known and are described in U.S. Pat. No. 4,740,584. Such partial curing produces cyanate ester-containing aryloxytriazine resins that can be further cured through the cyclotrimerization of the remaining cyanate ester moieties. Blends of cyanate ester prepolymers are described in U.S. Pat. Nos. 4,110,364 and 4,371,689. Blends of cyanate esters with thermoplastic polymers are disclosed in U.S. Pat. Nos. 4,157,360, 4,983,683, and 4,902,752.

Many of the aforementioned compositions however are not flame retardant and their use in electrical applications, where flame retardancy is critical, is limited. Flame retardant cyanate ester blends are described in Japanese Patent Nos. 05339342 and U.S. Pat. No. 4,496,695, which describes blends of cyanate esters and brominated epoxies, or polyphenylene ether (PPE), cyanate esters and brominated epoxies. Epoxy resins however are known to have inferior electrical properties relative to cyanate esters, and the corresponding cyanate ester-epoxy blends do not have optimal electrical properties.

These issues have been addressed by preparing blends of brominated cyanate esters as disclosed in U.S. Pat. Nos. 4,097,455 and 4,782,178. Blends of cyanate esters with the bis(4-vinylbenzylether)s or brominated bisphenols are also described in U.S. Pat. Nos. 4,782,116, and 4,665,154. Blends of cyanate esters with brominated poly(phenylene ether)s, polycarbonates or perbromobenzylacrylates are disclosed in Japanese Patent No. 08253582.

However, curable compositions comprising cyanate esters are still sought, and there is still a need for curable compositions that can have electrical applications.

SUMMARY OF THE INVENTION

The present invention provides curable compositions comprising (a) a compound selected from the group consisting of a cyanate ester, a cyanate ester prepolymer, and mixtures thereof; (b) a cyanate ester-free aryloxytriazine, and (c) a catalyst. The present compositions provide the desired flame retardant properties (UL-94 flammability of V-1 or better) which are useful in electrical applications.

DETAILED DESCRIPTION OF THE INVENTION

In one embodiment of the present invention is provided a composition where the cyanate ester is represented by the structure of Formula I

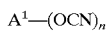

Formula I wherein $A^1$ is a $C_{6-200}$ aromatic or mixed aromatic-aliphatic hydrocarbon radical containing a member or members selected from the group consisting of oxygen, nitrogen, halogen, sulfur, phosphorus, boron, silicon, hydrogen, and mixtures thereof, and "n" represents an integer from about 1 to about 10. In a preferred embodiment of this invention n represents an integer from about 2 to about 5, and most preferably from about 2 to about 3. Typical of this type are the cyanate ester compounds wherein n=2. Illustrative examples of cyanate ester compounds are bis(4-cyanatophenyl)methane, bis(3-methyl-4-cyanatophenyl)methane, bis(3-ethyl-4-cyanatophenyl)methane, bis(3,5-dimethyl-4-cyanatophenyl)methane, 1,1-bis(4-cyanatophenyl)ethane, 2,2-bis(4-cyanatophenyl)propane, 2,2-bis(4-cyanatophenyl)1,1,1,3,3,3-hexafluoropropane, di(4-cyanatophenyl)ether, di(4-cyanatophenyl)thioether, 4,4-dicyanatobiphenyl, 1,3-bis(4-cyanatophenyl-1-(1-methylethylidene))benzene, 1,4-bis(4-cyanatophenyl-1-(1-methylethylidene))benzene and resorcinol dicyanate. Also useful are cyanate esters of Formula I wherein n>2. Examples of such materials include the cyanate ester of phenol formaldehyde novolak, cyanate ester of phenol dicyclopentadiene novolak, 1,1,1-tris(4-cyanatophenyl)ethane.

Cyanate ester prepolymers that can be used in the present invention are prepolymers produced by partial curing of the cyanate ester in the presence or absence of a catalyst. A typical example of such a cyanate ester prepolymer is partially cured bis(3,5-dimethyl-4-cyanatophenyl)methane, sold under the tradename AroCy M-20 by Ciba. A detailed description of cyanate ester and cyanate ester prepolymers can be found in "The Chemistry and Technology of Cyanate Esters" by I.A. Hamerton® 1994, Blackie Academic and Professional, a n imprint of Chapman and Hall, which is incorporated herein by reference.

The cyanate ester-free aryloxytriazine component useful in the present invention is represented by Formula II:

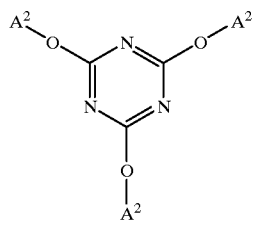

Formula II wherein $A^2$ is a $C_{6-200}$ aromatic or alternatively a mixed aromatic-aliphatic hydrocarbon radical, alternatively containing a member or members selected from the group consisting of oxygen, nitrogen, halogen, sulfur, phosphorus, boron, silicon, and mixtures thereof, such that at least one $A^2$ is aromatic and each $A^2$i free of cyanate ester groups.

Preferred cyanic acid ester-free triazine resins useful in the present invention include tris(triphenoxy)-1,3,5-triazine, and substituted derivatives thereof such as tris(2,4,6-tribromophenoxy)-1,3,5-triazine, tris(2-allylphenoxy)-1,3,5-triazine, tris(4-allylphenoxy)-1,3,5-triazine, tris(2-methoxy-4-allylphenoxy)-1,3,5-triazine, tris(4-vinylphenoxy)-1,3,5-triazine. In applications requiring UL-94 V-0 flame retardancy, the use of brominated triazines such as tris(2,4,6-tribromophenoxy)-1,3,5-triazine is preferred. The level of incorporation of brominated triazines typically falls in the range from about 10% to about 30% by weight of the total composition.

Catalysts, as used in the present invention, include a compound selected from the group consisting of carboxylate salts, phenols, alcohols, amines, urea derivatives, imidazoles, and metal chelates. Preferred catalysts include octoate, carboxylate, or acetylacetonate salts of zinc, cobalt, copper, manganese, iron, nickel, or aluminum.

It is understood that a catalyst includes low molecular weight or polymeric entities, and as such includes thermoplastics and elastomers. In another embodiment of the present invention, the catalyst is a phenolic compound. Phenolic compounds particularly useful in the present invention are represented by Formula III:

$$A^3-(OH)_m \qquad \text{Formula III}$$

wherein $A^3$ is $C_{6-1000}$ aryl, optionally substituted with aryl, $C_{1-20}$ alkyl, alkoxy, aryloxy, carboxy, thio, sulfonyl, containing optionally a member or members selected from the group consisting of oxygen, nitrogen, halogen, sulfur, phosphorus, boron, silicon, hydrogen, and mixtures thereof, and "m" represents an integer from about 1 to about 200, and preferably from about 1 to about 5.

Typical compounds represented by structures of Formula III include alkylphenols such as nonylphenol, or dinonylphenol, octylphenol, 3(2-hydroxyphenyl)propionic acid, 3(2-hydroxyphenyl)propanol, 2-methoxy-4-allylphenol, 2-allylphenol and bisphenols including 2,2-bis(4-hydroxyphenyl)propane, 2,2-bis(4-hydroxy-3-methylphenyl)propane, 2,2-bis(3,5-dimethyl-4-hydroxyphenyl)propane, 1,1-bis(4-hydroxyphenyl)cyclohexane, 1,1-bis(4-hydroxyphenyl)cyclopentane, 2,2-bis(3,5-dibromo-4-hydroxyphenyl) propane, bis(4-hydroxyphenyl)methane, 2,2-bis(3-allyl-4-hydroxyphenyl)propane, 2,2-bis(2-t-butyl-4-hydroxy-5-methylphenyl) propane, 2,2-bis(3-t-butyl-4-hydroxy-6-methylphenyl)propane, 2,2-bis(3-t-butyl-4-hydroxy-6-methylphenyl)butane, 1,3-bis(4-hydroxyphenyl-1-(1-methylethylidene))benzene, 1,4-bis(4-hydroxyphenyl-1-(1-methylethylidene))benzene, 1,3-bis(3-t-butyl-4-hydroxy-6-methylphenyl-1-(1-methylethylidene))benzene, 1,4-bis(3-t-butyl-4-hydroxy-6-methylphenyl-1-(1-methylethylidene))benzene, 4,4'-biphenol, 2,2',6,6'-tetramethyl-3,3',5,5'-tetrabromo-4,4'-biphenol, 2,2',6,6'-tetramethyl-3,3',5-tribromo-4,4'-biphenol, 4,4-bis(4-hydroxyphenyl)heptane, 1,1-bis(4-hydroxyphenyl)-2,2,2-trichloroethane, 2,2-bis(4-hydroxyphenyl-1,1,1,3,3,3-hexafluoropropane, 1,1-bis(4-hydroxyphenyl)-1-cyanoethane, 1,1-bis(4-hydroxyphenyl)dicyanomethane, 1,1-bis(4-hydroxyphenyl)1-cyano-1-phenylmethane, 2,2-bis(3-methyl-4-hydroxyphenyl) propane, 1,1-bis(4-hydroxyphenyl)norbornane, 9,9-bis(4-hydroxyphenyl)fluorene, 3,3-bis(4-hydroxyphenyl) phthalide, 1,2-bis(4-hydroxyphenyl)ethane, 1,3-bis(4-hydroxyphenyl)propenone, bis(4-hydroxyphenyl) sulfone, bis(4-hydroxyphenyl) sulfide, 4,4'-oxydiphenol, 2,2-bis(4-hydroxy-3-methylphenyl)propane, 2,2-bis(3,5-dimethyl-4-hydroxyphenyl)propane, 4,4-bis(4-hydroxyphenyl) pentanoic acid, 4,4-bis(3,5-dimethyl-4-hydroxyphenyl) pentanoic acid, 2,2-bis(4-hydroxyphenyl) acetic acid, hydroquinone, resorcinol, and the like.

Phenolic catalysts in the present invention include novolak type resins such as phenol-formaldehyde, cresol-formaldehyde, naphthol-formaldehyde, naphthol-phenol-formaldehyde resins and brominated phenol-formaldehyde resins, phenol-dicyclopentadiene and phenol-polybutadiene resins. Also included are hydroxy terminated thermoplastic resins such as poly(phenylene ether) (hereinafter PPE); hydroxy-terminated poly(phenylene ether sulfone), hydroxy-terminated poly(phenylene ether ketone); hydroxy-terminated poly(sulfone), and the like.

The PPEs that can be used in the present invention include all PPEs known in the literature. These materials are generally prepared by oxidative polymerization. A variety of catalysts can be used for the preparation of PPEs via oxidative polymerization. Illustrative examples of carboxylate salts and metal chelates are those that contain at least one transition metal such as copper, manganese, or cobalt. A preferred catalyst system comprises a copper containing compound. Illustrative examples of such catalysts are disclosed in U.S. Pat. Nos. 3,306,874, 3,306,875, 3,914,266 and 4,028,341, and are incorporated herein by reference.

The PPE component of the instant invention, when used as a catalyst, is represented by structures of Formula IV, but can alternatively comprise a plurality of structural units such as those represented by structures of Formulas V and VI:

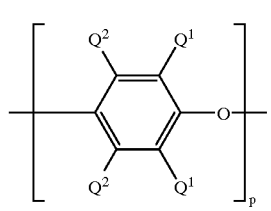

Formula IV

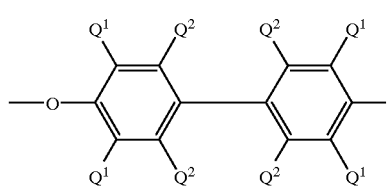

Formula V

, and

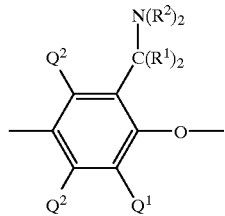

Formula VI wherein $Q^1$ and $Q^2$ independently represent hydrogen, halogen, $C_{1-10}$ alkyl, $C_{6-12}$ aryl, mixed alkyl-aryl hydrocarbons, alkoxy, or thioalkyl; $R^1$ at each occurrence independently represents hydrogen, $C_{1-10}$ alkyl, or $C_{6-10}$ aryl; $R^2$ at each occurrence is independently hydrogen, or $C_{1-20}$ alkyl, preferably a $C_1$–$C_{10}$ alkyl; and "p" represents an integer from about 1 to about 200.

The PPE in structure V is formed by reaction of PPE with a diphenoquinone. Reactions between PPEs and diphenoquinones yielding incorporated biphenylene units of structure V can occur during polymerization or in subsequent processing steps.

Structural units of Formula VI are also observed in poly(phenylene ether)s prepared by oxidative polymerizations carried out in the presence of an amine, preferably a primary or secondary amine, using a copper or manganese containing catalyst. Preferred are structures wherein $R^1$ is hydrogen, and $R^2$ independently represents a $C_{1-10}$ alkyl radical. Numerous beneficial effects, including increased impact strength, and other properties are discussed in U.S. Pat. Nos. 4,054,553, 4,092,294, 4,477,651, and 4,517,341, which are incorporated herein by reference.

Other PPE polymers in the present invention include those that are formed by oxidative copolymerization of phenols, illustrative examples are 2,6-dimethylphenol and 2,3,6-trimethylphenol. Such copolymers are generally classified as poly (2,6-dimethyl-1,4-phenylene-co-2,3,6-trimethyl-1,4-phenylene ether)s. These materials are known to have higher glass transition temperatures than poly(2,6-dimethyl-1,4-phenylene ether), and are expected to impart these properties to the resulting thermoset blend. Also included within this class of polymers are those produced by copolymerization of a phenol such as 2,6-dimethylphenol and a polyfunctional phenol such as the bisphenol, 2,2-bis (3,5-dimethyl-4-hydroxyphenyl)propane, so as to produce a bifunctional phenol polymer. Typical polyfunctional phenols, and the resulting poly(phenylene ether) polymers produced from them, include those described in U.S. Pat. No. 5,352,745, which are incorporated herein by reference.

Brominated derivatives of PPEs, prepared by addition of bromine to an organic solution of the PPE, are included in the instant invention. Such brominated derivatives are produced by direct bromination of a PPE. They are also prepared by polymerization of a brominated monomer, or copolymerization of said monomer with another monomer. Typical examples of such processes would include the homopolymerization of 3,4-dibromo-2,6-dimethylphenol or its copolymerization with 2,6-dimethylphenol by means known to one skilled in the art. The homopolymer derived from 2,6-dibromophenol or 2,4,6-tribromophenol under oxidative coupling conditions can also be used.

Reaction products of PPE resins with compounds containing a carbon—carbon double bond or alcohol group are included in the present invention. Typical of this class of compounds are maleic anhydride, citraconic anhydride, maleic acid, fumaric acid, citric acid, malic acid, triallylisocyanurate, triallylcyanurate, and diallylphthalate. Generally the reactions are carried out by heating the PPE resin with a compound containing a carbon-carbon double bond or alcohol at temperatures above about 180° C. either with or without a free radical producing agent such as a peroxide. More than one of the above carbon-carbon double bond or hydroxyl containing compounds may be reacted with the PPE resin, either together or sequentially.

For the purposes of this invention, low molecular weight PPEs are desirable to enhance flow and improve processability. PPEs used in the instant invention typically have an intrinsic viscosity of between about 0.07 and about 0.30 deciliter per gram (dl/g), as measured in chloroform at 25° C. As described above, these low molecular weight PPEs may be produced by oxidative polymerization. Alternatively they may be produced by reaction of a phenol and an oxidizing agent, or alternatively an oxidizing agent with a phenol with a higher molecular weight PPE.

For example, low molecular weight PPEs may be produced by redistribution of a phenol compound, such as described by structure III, with PPE in the presence of a redistribution catalyst.

Redistribution catalysts include peroxides such as those represented by structures of Formula VII.

$$A^4\text{—O—O—}A^4 \qquad \text{Formula VII}$$

wherein $A^4$ at each occurrence is independently hydrogen, alkyl, aryl, aroyl, alkanoyl, alkenoyl, alkoxycarbonyl, sulfuryl, sulfonyl, or phosphoryl.

Typical of compounds represented by Formula VII are diacyl peroxides such as benzoylperoxide, 4,4-di-t-butylbenzoyl peroxide or other aryl substituted derivatives, dilauryl peroxide, acetyl benzoylperoxide, acetyl cyclohexylsulfonyl peroxide or diphthaloyl peroxide, peroxydicarbonates such as diacetylperoxydicarbonate, peroxyacids such as perbenzoic acid, 3-chloroperbenzoic acid, 4-nitroperbenzoic and other substituted derivatives of perbenzoic acid, peroxyacetic acid peroxypropanoic acid, peroxybutanoic acid, peroxynonanoic acid, peroxydodecanoic acid, diperoxyglutaric acid, diperoxyadipic acid, diperoxyoctanedioic acid, diperoxynonanedioic acid, diperoxydodecandioic acid, monoperoxyphthalic acid, as well as inorganic peroxyacids such as peroxysulfuric, peroxydisulfuric, peroxyphosphoric, peroxydiphosphoric and their corresponding salts and peroxycarboxylic esters such as t-butylperformate, t-butyl peracetate, t-butyl peroxyisobutyrate, t-butylperbenzoate, cumyl perbenzoate, t-butyl peroxynonanoate, t-butylmonoperoxymaleate, t-butylmonoperoxyphthalate, di-t-butyl diperoxyadipates, and 2,5-dimethyl-2,5-bis (benzoylperoxy)hexane.

Other redistribution catalysts in the present invention are quinones or diphenoquinones such as benzoquinone or preferably 2,2',6,6'-tetramethyldiphenoquinone (TMDQ).

When a phenolic compound represented by Formula III is redistributed with PPE, a compound represented by Formula VIII is formed wherein $Q^1$, $Q^2$, $A^3$, m and p are as previously described.

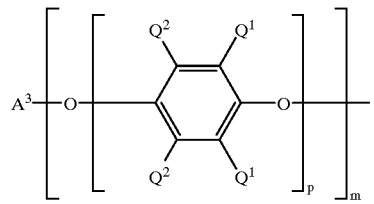

Formula VIII

Low molecular weight PPEs can also be prepared by reacting a PPE with an oxidizing agent in the absence of a phenolic compound. This would include, for example, the reaction of a PPE with a peroxide such as benzoyl peroxide or the treatment of a PPE with a quinone such as 2,2',6,6'-tetramethyl diphenoquinone (TMDQ).

The aforementioned structural variations of the PPE are listed to illustrate some of the structures of PPEs that can be used in the instant invention. From the foregoing, it will be apparent to those skilled in the art that the PPEs contemplated for use in the present invention include all those presently known, irrespective of the method of production, isolation or variations in structural units, ancillary chemical features or modifications.

Included in the compositions of the instant invention are curable compositions wherein a filler or an additive may be incorporated in order to impart or enhance desired properties to the claimed composition. Such properties include dielectric constant, dissipation factor, thermal conductivity and flow. Representative examples of fillers include carbon black, silica, alumina, magnesia, talc, mica, glass beads, hollow glass beads, hollow glass fibers and the like. Representative examples of additives include antioxidants, plasticizers, pigments, dyes, colorants, ceramic additives to enhance electrical properties, and flame retardants or agents used to enhance the flame retardancy of the resin. Materials in the additive class include inorganic antimony compounds such as $Sb_2O_3$, $Sb_2O_5$, $NaSbO_3.1/4H_2O$ and the like. Furthermore an additional thermoset, thermoplastic or elastomeric resin can be included in the compositions of the present invention, either alone or in combination, for the purpose of improving properties such as toughness, impact strength or thermal stability.

The present invention includes compositions containing a reinforcement to lend structural integrity to the thermoset blend. Reinforcing materials known to one skilled in the art can be used including but not limited to, inorganic and organic reinforcements, such as woven or non-woven glass fabrics of the E-, NE-, S-, T and D-style glasses and quartz, and the like. They may be in the form of glass roving cloth, glass cloth, glass chopped glass mat, glass surfacing mat, and non-woven glass fabric, ceramic fiber fabrics, and metallic fiber fabrics. In addition, synthetic organic reinforcements may also be used in the present invention and would include organic polymers capable of forming fibers. Illustrative examples of such organic fibers are poly(ether ketone), polyimide benzoxazole, poly(phenylene sulfide), polyesters, aromatic polyamides, aromatic polyimides or polyetherimides, acrylic resins, and poly(vinyl alcohol). Fluoropolymers such as polytetrafluoroethylene, can be used in the present invention. Also included are natural organic fibers known to one skilled in the art, including cotton cloth, hemp cloth, and felt, carbon fiber fabrics, and natural cellulosic fabrics such as Kraft paper, cotton paper, and glass fiber containing paper. Such reinforcements could be in the form of monofilament or multifilament fibers and could be used either alone or in combination with another type of fiber, through, for example, coweaving or core-sheath, side-by-side, orange-type or matrix and fibril constructions or by other methods known to one skilled in the art of fiber manufacture. They could be in the form of, for example, woven fibrous reinforcements, non-woven fibrous reinforcements, or papers.

Coupling agents, incorporated into the reinforcing material, are known in the art to improve adhesion of the fibrous reinforcement to the cured resin composition. For the purposes of this invention, representative coupling agents are silane-, titanate-, aluminum-, and zircoaluminum-based coupling agents and other agents known to one skilled in the art.

The cured composition of the present invention can be used in the form of a film or a laminate structure comprising a metal foil and at least one cured resin composition layer disposed on at least one surface of said metallic foil. Representative metallic foils useful in the present invention are copper foil, aluminum foil and the like. Generally the thickness of the metallic foil is from about 5 µm to about 200 µm, and preferably from about 5 µm to 100 µm.

The cured composition may be cured by any of a number of techniques known to one skilled in the art, including heating, exposure to light or an electron beam. When heating is used, a temperature is chosen on the basis of whether a radical initiator or curing agent is used. The temperature selected can be from about 800 to about 300° C., and preferably from about 120° to about 240° C. The heating period can be from about 1 minute to about 10 hours, preferably from about 1 minute to about 6 hours.

EXAMPLES

Cured cyanate ester-triazine laminates were generated by initially preparing a 50% (weight percent) solution of the curable composition (Tables 2–3).

After formulation as described above, the desired reinforcement was impregnated with the resin solution. The resulting impregnated fabric was heated at 150° C. for 7 minutes to remove solvent and partially cure the thermoset. The resulting reinforced prepregs were layered and heated in a compression mold at approximately 200° C. for 3 hours so as to produce 6–8 ply laminates. The physical properties of the laminates so produced are shown in Table 2–3. These composites exhibited excellent dielectric properties, critical to their use in applications such as printed circuit boards, randome structures and antenna coatings.

Table 1 shows the molecular weights and intrinsic viscosities of PPE resins examined in this study. PPE resins were prepared by A) oxidative polymerization of 2,6-xylenol; B) redistribution of a 0.40 IV poly(2,6-dimethyl-1,4-phenylene ether) (PPO® resin, a trademark of the General Electric Co.) with bisphenol-A using a benzoyl peroxide catalyst; As shown in Table 3 the redistribution reaction could also be carried out just prior to formulation without isolation of the PPE polymer.

TABLE 1

PPE resins examined in PPE-polycyanurate thermosets. Molecular weights determined by GPC and calculated relative to polystyrene standards.

| PPE Resin | Method of Preparation | Mn | Mw | Intrinsic Viscosity (IV) (dl/g) |
|---|---|---|---|---|
| #1 | A | 18,977 | 46,586 | 0.40 |
| #2 | A | 5,105 | 23,642 | 0.14 |
| #3 | B | 4,329 | 12,801 | 0.12 |

Method A. Oxidative coupling of 2,6-xylenol. Method B. Redistribution of PPE Resin 1 with 2,2-bis(4-hydroxyphenyl)propane and benzoyl peroxide.

Tables 2 and 3 show typical E-glass reinforced cyanate ester-triazine compositions cured using zinc octoate and phenol catalysts. Examples 3–7 show typical E-glass reinforced cyanate ester-triazine compositions cured using a zinc octoate catalyst and PPE resin catalyst. As shown these resins produced laminates with $T_g$s 182–235° C., dielectric constants ranging from 3.8–4.5 and dissipation factors ranging from 0.0016–0.0030. The excellent electrical and thermal properties of these compositions make them extremely useful in applications such as printed circuit boards, antenna coatings, encapsulating resins, matrices for abrasives, or thermosetting adhesives.

TABLE 2

E-glass reinforced cyanate ester-triazine compositions All components given in parts by weight Samples prepared using 7628 style E-glass reinforcement

| Formulation # | 1 | 2 | 3 | 4 | 5 |
|---|---|---|---|---|---|
| Cyanate Ester Component | | | | | |
| bis(4-cyanato-3,5-dimethyl-phenyl)methane (M-10; Ciba-Geigy Co.) | 79.85 | — | 54.70 | 27.35 | 54.85 |
| 1,3-bis(4-cyanatophenyl-1-(L-methylethylidene))benzene (XU-366; Ciba-Geigy Co.) | — | 79.85 | — | — | — |
| bis(4-cyanato-3,5-dimethyl-phenyl)methane prepolymer (M-20; Ciba-Geigy Co.) | — | — | — | 27.35 | — |
| Aryloxy Triazine Component | | | | | |
| Tris(2,4,6-tribromophenoxy)-1,3,5-triazine | 15.00 | 15.00 | 15.00 | 15.00 | 20.00 |
| Phenolic Component | | | | | |
| 4-(t-octyl)phenol | 5.00 | 5.00 | — | — | — |
| PPE Resin #3 | — | — | 30.00 | 30.00 | — |
| PPE Resin #2 | — | — | — | — | 25.00 |
| Additional Curing agent or Catalyst | | | | | |
| Zinc octoate | 0.15 | 0.15 | 0.30 | 0.30 | 0.15 |
| Properties | | | | | |
| Glass Transition Temperature (Tg) | 232 | 182 | 235 | 230 | 231 |
| z-axis expansion | — | — | 2.01 | 2.01 | — |
| methylene chloride resistance | good | good | good | good | fair |
| Resin Content | 28.44 | 29.24 | 27.8 | 51.7 | 35.5 |
| Dielectric Constant (1 MHz) | 4.36 | 4.34 | 4.50 | 3.40 | |
| Dissipation Factor (1 MHz) | 0.0030 | 0.0020 | 0.0016 | 0.0014 | |
| UL-94 Flammability | V-O | V-O | V-O | V-O | V-O |
| Moisture Absorption | 0.17 | 0.08 | 0.21 | 0.22 | 0.15 |
| Solder Resistance | good | good | good | good | good |

Because the availability of low molecular weight PPE resins is not widespread, in situ preparation of low molecular weight PPE resins from readily available, higher molecular weight PPE resins is of particular importance in this invention. As shown this can be accomplished by redistribution of a 0.40 IV PPO® resin (General Electric Co.) with 2,2-bis(4-hydroxyphenyl)propane (bisphenol-A) and a benzoyl peroxide oxidizing agent, or with an oxidizing agent alone. Table 3 shows the results of PPE- cyanate ester-triazine compositions prepared by the first method. In this instance, 2,2-bis(4-hydroxyphenyl)propane and benzoyl peroxide were used at levels of 4 weight percent of the PPO amount or 1.11 weight percent of the total composition.

TABLE 3

E-glass reinforced cyanate ester-triazine compositions containing a PPE catalyst All components given in parts by weight Samples prepared using 7628 style E-glass reinforcement

| Formulation # | 6 | 7 |
|---|---|---|
| Cyanate Ester Component | | |
| bis(4-cyanato-3,5-dimethyl-phenyl)methane (M-10; Ciba-Geigy Co.) | 54.76 | 46.53 |
| bis(4-cyanato-3,5-dimethyl-phenyl)methane prepolymer (M-20; Ciba-Geigy Co.) | | 8.23 |
| Aryloxy Triazine Component | | |
| Tris(2,4,6-tribromophenoxy)-1,3,5-triazine | 15.01 | 15.01 |
| Phenolic Resin Component | | |
| PPE Resin #1 | 27.81 | 27.81 |
| Benzoyl Peroxide | 1.11 | 1.11 |
| Bisphenol-A | 1.11 | 1.11 |
| Additional Curing agent or Catalyst | | |
| Zinc octoate | 0.20 | 0.15 |
| Properties | | |
| Glass Transition Temperature (Tg) | 225 | 215 |
| Methylene chloride resistance (M-2/23) | 0.83 | 1.02 |
| Copper Peel Strength | 10.5 | 10.5 |
| Resin Content (%) | 37.4 | 41.4 |
| Dielectric Constant (1 MHz) | 3.959 | 3.854 |
| Dissipation Factor (1 MHz) | 0.00268 | 0.00267 |
| Moisture Absorption (%) | 0.13 | 0.11 |
| UL-94 Flammability | V-O | V-O |
| Burn Time (seconds) | 11.1 | 24.6 |
| Solder Resistance (seconds to blister @ 550 F) | 300 | 300 |

What is claimed is:

1. A curable composition comprising
   (a) a compound selected from the group consisting of a cyanate ester, a cyanate ester prepolymer, and mixtures thereof;
   (b) a cyanate ester-free aryloxytriazine; and (c) a catalyst selected from the group consisting of a phenol containing compound, and a phenol containing polymer, wherein the phenol containing polymer is poly(2,6-dimethyl-1,4-phenylene)oxide, poly(2,3,6-trimethyl-1,4-phenylene) oxide, or poly(2,6-dibromo-1,4-phenylene) oxide.

2. A curable composition comprising:

(a) a compound selected from the group consisting of a cyanate ester a cyanate ester prepolymer, and mixtures thereof, wherein the cyanate ester is selected from the group consisting of 2,2-bis(4-cyanatophenyl)propane, bis(3,5-dimethyl-4-cyanatophenyl)methane, 1,3-bis(4-cyanatophenyl-1-(1-methylethylidene))benzene, and 1,4-bis(4-cyanatophenyl-1-(1-methylethylidene))benzene, and the cyanate ester prepolymer is selected from the group consisting of prepolymers of 2,2-bis(4-cyanatophenyl)propane, bis(3,5-dimethyl-4-cyanatophenyl)methane, 1,3-bis(4-cyanatophenyl-1-(1-methylethylidene))benzene, and 1,4-bis(4-cyanatophenyl-1-(1-methylethylidene))benzene;

(b) tris(2,4,6-tribromophenoxy)-1,3,5-triazine; and (c) a catalyst selected from the group consisting of hydroxy capped poly(ether)sulfone, poly(phenylene ether), octyl phenol, nonyl phenol, and phenol formaldehyde novolak, or mixtures thereof.

3. A curable composition comprising:

(a) a compound selected from the group consisting of a cyanate ester, a cyanate ester prepolymer, and mixtures thereof, wherein the cyanate ester is selected from the group consisting bis(3,5-dimethyl-4-cyanatophenyl)methane, and 1,3-bis(4-cyanatophenyl-1-(1-methylethylidene))benzene, and the cyanate ester prepolymer is selected from the group consisting of prepolymers bis(3,5-dimethyl-4-cyanatophenyl)methane, and 1,3-bis(4-cyanatophenyl-1-(1-methylethylidene))benzene;

(b) tris(2,4,6-tribromophenoxy)-1,3,5-triazine; and (c) a catalyst selected from the group consisting of hydroxy capped poly(ether)sulfone, poly(phenylene ether), and octyl phenol, or mixtures thereof.

4. A curable composition comprising:

(a) a cyanate ester prepolymer of bis(3,5-dimethyl-4-cyanato-phenyl)methane and at least one cyanate ester selected from the group consisting of bis(3,5-dimethyl-4-cyanatophenyl)methane, and 1,3-bis(4-cyanatophenyl-1-(1-methylethylidene))benzene;

(b) tris(2,4,6-tribromophenoxy)-1,3,5-triazine; and (c) a catalyst comprising zinc octoate and a phenol-containing polymer, wherein the phenol-containing polymer comprises the reaction product of poly(2,6-dimethyl-1,4-phenylene oxide), bisphenol A, and benzoyl peroxide.

5. A curable composition comprising:

(a) a cyanate ester prepolymer of bis(3,5-dimethyl-4-cyanato-phenyl)methane and at least one cyanate ester selected from the group consisting of bis(3,5-dimethyl-4-cyanatophenyl)methane, and 1,3-bis(4-cyanatophenyl-1-(1-methylethylidene))benzene;

(b) tris(2,4,6-tribromophenoxy)-1,3,5-triazine; and (c) a catalyst comprising zinc octoate and a phenol-containing polymer, wherein the phenol-containing polymer comprises the reaction product of poly(2,6-dimethyl-1,4-phenylene oxide), bisphenol A, and benzoyl peroxide, wherein the curable composition is reinforced with a fibrous glass material.

6. A composition of claim 1 wherein the cyanate ester is represented by a structure of Formula I:

$$A^1-(OCN)_n \qquad \text{Formula I}$$

wherein:

$A^1$ is a $C_{6-200}$ aromatic or a mixed aromatic-aliphatic hydrocarbon radical, containing a member or members selected from the group consisting of oxygen, nitrogen, halogen, sulfur, phosphorus, boron, silicon, hydrogen, and mixtures thereof; and n represents an integer from about 1 to about 10.

7. A composition of claim 1 wherein the cyanate ester-free aryloxytriazine contains at least one bromine atom.

8. A composition of claim 6 wherein n represents an integer from about 2 to about 5.

9. A composition of claim 7 wherein the aryloxytriazine is a tris(phenoxy)triazine or a tris-(2,4,6-tribromophenoxy)-1,3,5-triazine.

10. A composition of claim 1 wherein the phenol containing polymer is the reaction product of a poly(phenylene ether), a bisphenol, and an oxidizing agent.

11. A composition of claim 1 wherein the phenol containing polymer is the reaction product of a poly(phenylene ether), and an oxidizing agent.

12. A composition of claim 1 wherein the phenol containing polymer is the reaction product of a poly(phenylene ether) and a compound containing a carbon-carbon double bond, or an alcohol group.

13. A composition of claim 1 further comprising an organic or an inorganic filler.

14. A composition of claim 1 in which the curable composition is reinforced using an inorganic or organic reinforcement.

15. A composition of claim 14 wherein the curable composition is reinforced with a fibrous glass material.

16. A composition of claim 1 comprising an inorganic or an organic filler and an organic or inorganic reinforcement.

17. A cured composition formed by curing the composition of claim 1.

18. The composition according to claim 1 wherein the fibrous glass material is E-glass.

19. The composition of claim 1 wherein the catalyst further comprises a carboxylate or acetylacetonate salt of zinc, copper, manganese, cobalt, iron, nickel, or aluminum.

20. The composition of claim 2 wherein the catalyst further comprises zinc octoate, zinc acetylacetonate, manganese acetylacetonate, copper acetylacetonate, or cobalt acetylacetonate.

21. The composition of claim 3 wherein the catalyst further comprises zinc octoate, zinc acetylacetonate, or manganese acetylacetonate.

* * * * *